United States Patent [19]
Fujita et al.

[11] Patent Number: 5,415,125
[45] Date of Patent: May 16, 1995

[54] METHOD OF FORMING A SEMICONDUCTOR BOULE

[75] Inventors: Hiromoto Fujita; Johji Nishio, both of Kanagawa, Japan

[73] Assignee: Kabushiki Kaisha Toshiba, Kanagawa, Japan

[21] Appl. No.: 979,045

[22] Filed: Nov. 19, 1992

[30] Foreign Application Priority Data

Nov. 21, 1991 [JP] Japan .................................. 3-306133

[51] Int. Cl.$^6$ ............................................. C30B 11/04
[52] U.S. Cl. ........................................ 117/17; 117/13; 117/21; 117/932
[58] Field of Search ............... 156/616.1, 616.2, 616.3, 156/621, 623 R, DIG. 93

[56] References Cited

U.S. PATENT DOCUMENTS

| | | | |
|---|---|---|---|
| 4,083,748 | 4/1978 | Gault | 156/616.2 |
| 4,404,172 | 9/1983 | Gault | 156/616.3 |
| 4,734,267 | 3/1988 | Kojimo | 117/208 |
| 4,840,699 | 6/1989 | Khattak et al. | 156/616.2 |
| 4,999,082 | 3/1991 | Kremer et al. | 156/616.3 |
| 5,007,980 | 4/1991 | Swiggand | 156/616.2 |
| 5,131,975 | 7/1992 | Bourret-Courchesne | 156/616.2 |

OTHER PUBLICATIONS

"Precise Melt Composition Control for LEC GaAs", Johji Nishio et al., Journal of Crystal Growth, 85:469-471 (1987).

*Primary Examiner*—R. Bruce Breneman
*Assistant Examiner*—Felisa Garrett
*Attorney, Agent, or Firm*—Finnegan, Henderson, Farabow, Garrett & Dunner

[57] ABSTRACT

A method of forming a semiconductor boule comprises the steps of providing a chamber having a crucible therein; introducing a first material and a second material into the crucible, the second material overlying the first material; heating the crucible to melt the first and second materials for substantially continuously covering the first material with the second material during the melting of the first and second materials; cooling the melt to grow a directly synthesized boule; and separating the grown boule from the crucible. In another embodiment, the method comprises steps of providing a chamber having a crucible therein; charging a first and a second material for forming the boule and a liquid encapsulant into the crucible, the volume of the intergranular space of charged first material being smaller than the volume of the molten second material; heating the crucible to melt the first and second materials; cooling the molten materials to grow the boule; and separating the grown boule from the crucible.

17 Claims, 4 Drawing Sheets

METHOD OF FORMING A SEMICONDUCTOR BOULE

BACKGROUND OF THE INVENTION

1. Field of the Invention

The present invention relates to a method of forming a semiconductor boule, and more particularly to a method of forming a semiconductor boule compound by a direct synthesis.

2. Description of the Related Art

A conventional method of forming a III-V semiconductor compound, such as a gallium arsenide (GaAs) boule, utilizes gallium (Ga) and arsenic (As) as starting materials and $B_2O_3$ as a liquid encapsulant. These materials are charged into a crucible and melted. The starting materials of gallium and arsenic, are directly synthesized in the crucible to make a GaAs boule.

The GaAs boule formed by this method is usually used for a substrate on which an electric device, such as a Hall sensor or a high frequency FET may be formed.

In a conventional method of manufacturing such electric device, using the GaAs substrate formed by direct synthesis, there is a problem in that the deviation among production lots becomes unacceptably large, and the yield of products (electric devices) deteriorates. This results in large deviations of characteristics among devices manufactured. It is believed that the deviations in characteristics are caused by deviations in the composition of the melt during the manufacture of the GaAs boule, resulting from an evaporation loss of arsenic during manufacture of the boule.

No practical method to suppress the deviations in the composition of the melt previously has been found. In other semiconductor boule compounds, for example, AlAs, InAs and GaSb, similar problem as with the GaAs boule has occurred.

Accordingly, a method for manufacturing semiconductor boule compound is desired in which deviations of the composition of the melt are reduced and a high quality boule is obtained.

An object of the invention is to provide a method of manufacturing a boule of semiconductor compound which can suppress deviations of composition of melt and obtain a high quality of boule. Additional objects and advantages of the invention will be apparent from the description which follows, or may be learned by practice of the invention.

SUMMARY OF THE INVENTION

To achieve the foregoing objects and advantages, and in accordance with the purposes of the invention as embodied and broadly described herein, the method of forming a semiconductor boule of the present invention comprises steps providing a chamber having a crucible therein; introducing a first material and a second material into the crucible, the second material overlying the first material; heating the crucible to melt the first and second materials for substantially continuously covering the first material with the second material during the melting of the first and second materials; cooling the melt to grow a directly synthesized boule; and separating the grown boule from the crucible. It is preferred that the introducing step includes the steps of selecting the first material from group V of the periodic table of elements and the second material from group III of the periodic table of elements. It is also preferred that the first material be selected from at least one of As and Sb, and the second material be selected from at least one of Ga, Al and In. The introducing step also preferably includes choosing a first material having a melting point higher than the melting point of the second material. A liquid encapsulant may also be added into the crucible.

Preferably, the first material is granular and has a grain size diameter less than about 3 mm and more than about 300 $\mu$m. The first material may comprise larger granular materials having a grain size smaller than 3 mm in diameter and smaller granular materials having a grain size greater than 300 $\mu$m in diameter, the smaller granular materials substantially surrounding the larger granular materials. Alternatively, the first material may comprise a mass corresponding in shape to the configuration of the lower portion of the crucible.

Another embodiment of the invention comprises the steps of providing a chamber having a crucible therein; charging a first and a second material for forming the boule and a liquid encapsulant into the crucible, the volume of the intergranular space of charged first material being smaller than the volume of the molten second material; heating the crucible to melt the first and second materials; cooling the molten materials to grow the boule; and separating the grown boule from the crucible.

BRIEF DESCRIPTION OF THE DRAWINGS

The accompanying drawings, which are incorporated in and constitute a part of the specification, illustrate the presently preferred embodiments of the invention and, together with the description, serve to explain the principles of the invention.

DETAILED DESCRIPTION OF THE PREFERRED EMBODIMENTS

Reference will now be made in detail to the present preferred embodiments of the invention, as illustrated in the accompanying drawings. In achieving the invention, the inventors examined, observed and considered deviations of composition of a GaAs melt. As a result, it was discovered that arsenic (As) evaporates through a liquid encapsulant by the heat of reaction between arsenic and gallium when the arsenic is not covered by the gallium (Ga) as the gallium melts during the heating of the gallium and arsenic.

In accordance with the invention, when arsenic or another suitable element is completely covered by melting gallium or another suitable element during the direct synthesis, the evaporation of arsenic can be suppressed. Accordingly, deviations in the composition of the GaAs melt can be decreased significantly and as a result, a higher quality and more uniform GaAs boule can be obtained.

Figure 1:
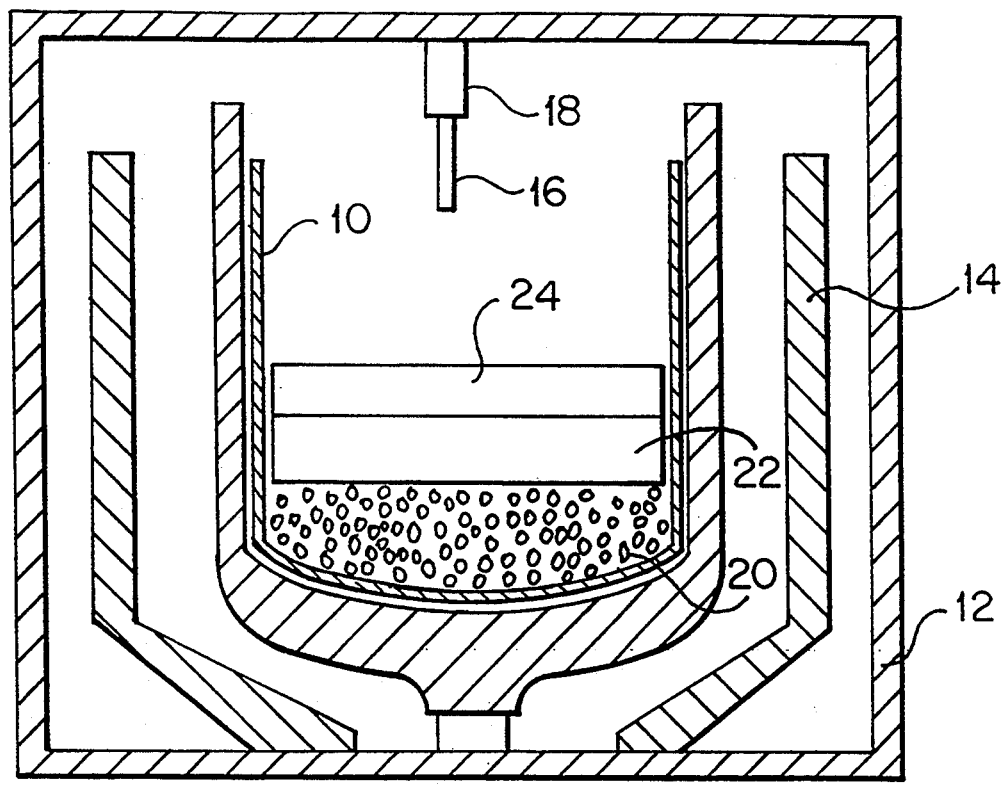
FIG. 1 and FIG. 2 show schematic sectional views of a boule forming system used in practicing a first embodiment of the invention.

FIG. 1 illustrates a first embodiment according to the invention, and is a schematic sectional view of a boule pulling system using a liquid encapsulated Czochralski method.

A crucible 10 in a chamber 12 is made of a pyrolytic boron nitride (pBN). A heater 14 is provided so as to surround crucible 10. A seed crystal 16 is attached to a pull rod 18 at the upper side on the inner surface of chamber 12.

A 1700 g charge of arsenic (As) 20 and a 1500 g charge of gallium (Ga) 22 are loaded into crucible 10 as starting materials. Then, 600 g of a liquid encapsulant 24, such as $B_2O_3$, is also charged into crucible 10.

In the first embodiment, arsenic having a grain size diameter less than about 3 mm and more than about 300 $\mu$m, is particularly selected and used. The lower limit should be a size at which particles of arsenic do not float to the surface of a melt.

After charging of these materials, the length from the upper surface of arsenic 20 to the upper edge of crucible 10 was measured. Based on the volume of crucible 10, and the density and charge weight of arsenic, the clearance volume for the charged arsenic 20 in crucible 10 was calculated. As used herein, the term clearance volume means the volume of the intergranular space between the granules of arsenic in the crucible 10. It was found that the clearance volume for charged arsenic 20 was smaller than the volume of gallium 22.

A method of directly synthesizing a boule according to a first embodiment is described below. First, crucible 10, with materials 20, 22 and 24 as explained above, is heated by heater 14 and chamber 12 is evacuated to $1 \times 10^{-2}$ Torr. After this, chamber 12 is exposed to argon (Ar) gas at a pressure of 40 kg/cm$^2$. The charged materials are melted by heater 14 to directly synthesize the gallium 22 and the arsenic 20.

Figure 2:
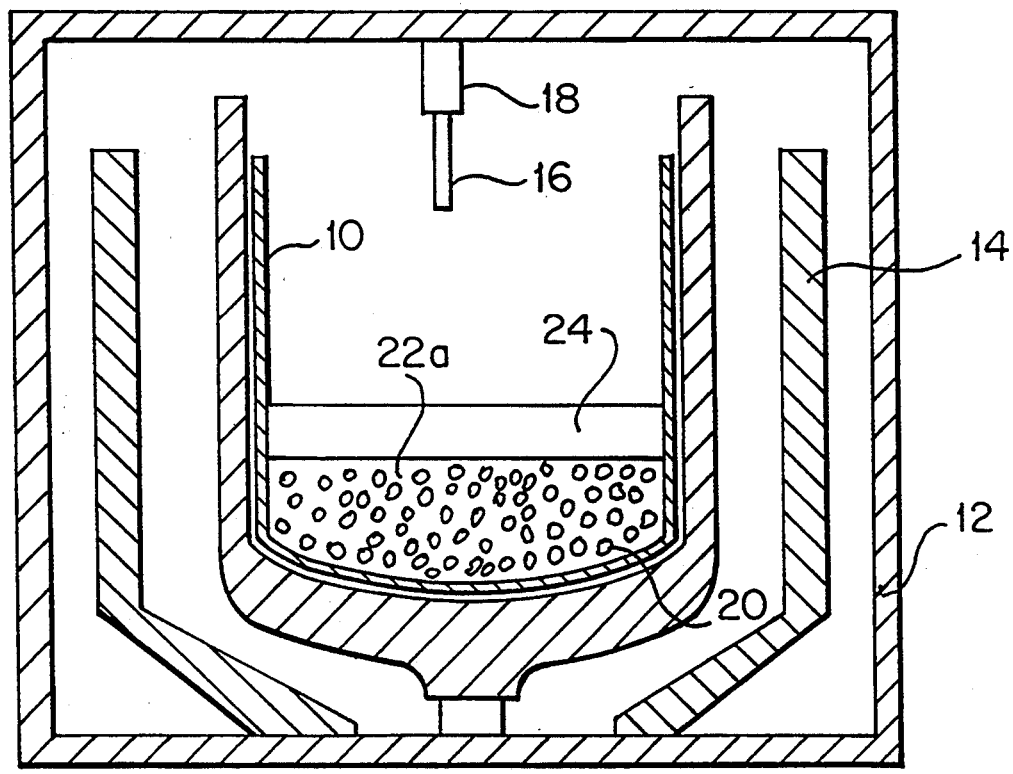

FIG. 2 shows a schematic view, based on observation of the process with a TV camera, of the crucible 10 just before the direct synthesis. As is apparent from FIG. 2, the arsenic 20 is completely covered by the molten gallium 22a.

Next, seed crystal 16 is moved down to contact the melt of starting charges, and seed crystal 16 is pulled up at a speed of 7 mm/hour.

Following these steps, a GaAs boule according to the first embodiment is obtained. A substrate is cut from the GaAs boule, and a high frequency FET is formed on the substrate. As a result, about 60% of the yield of the FET can be obtained. The yield is greatly improved, compared with the 45% yield obtained using the conventional method.

A similar process for forming a boule was repeated ten times and deviations in the amount of evaporated arsenic after the process were measured. The measured deviations ranged from 29.3 g to 30.9 g.

For comparison, deviations in the amount of evaporated arsenic according to a conventional method which does not follow the steps of the invention were measured. In the conventional method, the grain size diameter of the arsenic is larger e.g., 5 to 10 mm, than the size diameter in the first embodiment. Otherwise, this method was the same as the first embodiment. The process was repeated ten times, and deviations in the amount of evaporated arsenic were measured. The measured deviations ranged from 36.9 g to 61.1 g.

Figure 3:
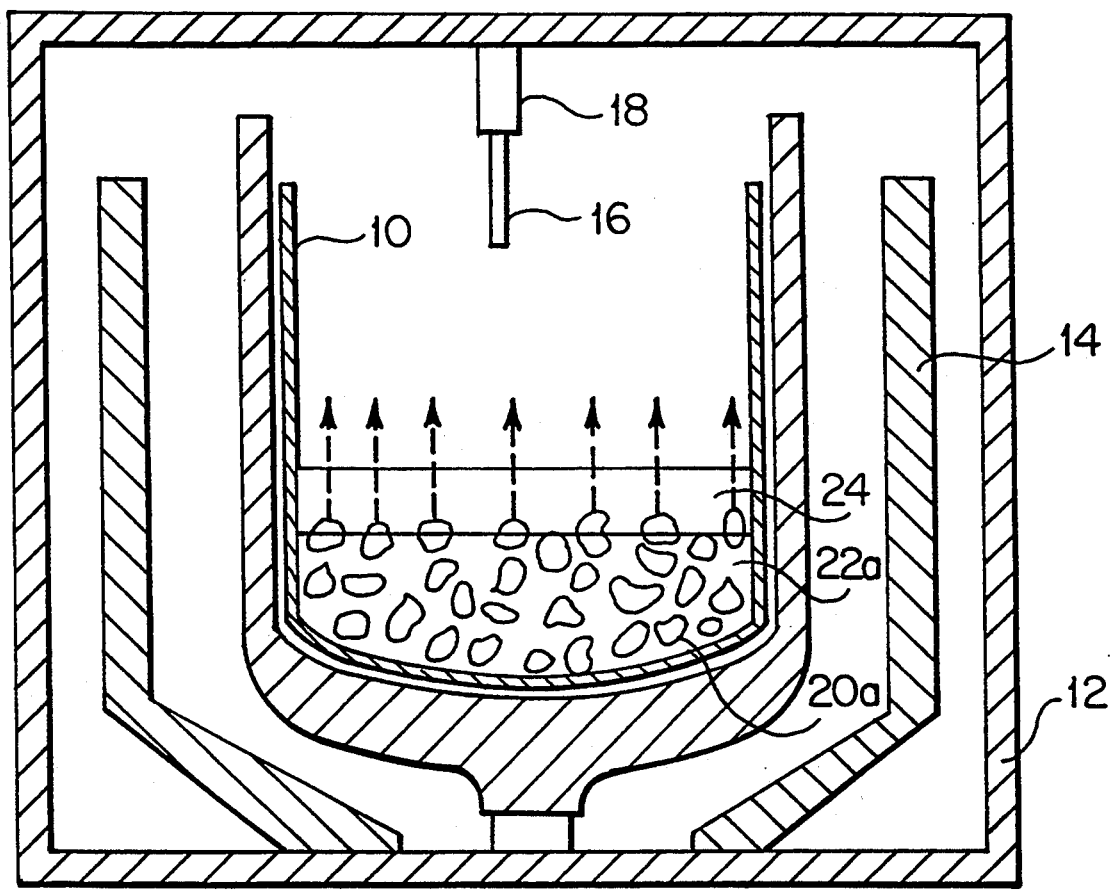
FIG. 3 shows a schematic sectional view of a boule pulling system which uses a conventional method, for comparison with the invention.

The difference between the first embodiment and the conventional method is illustrated by reference to FIG. 3. FIG. 3 is a schematic view of a conventional boule pulling system. In this figure, similar reference numbers are used for elements as in FIG. 1.

As apparent from FIG. 3, the grain size diameter of the arsenic 20a is larger than that in the first embodiment, and the clearance volume of the charge is so large that a part of the arsenic is exposed above the surface of the gallium melt 22a. Thus, a some of the arsenic evaporates from the exposed arsenic.

A second embodiment of the invention, utilizing a liquid encapsulant according to the Bridgman method, is described with reference to FIG. 4 and FIG. 5.

Figure 4:
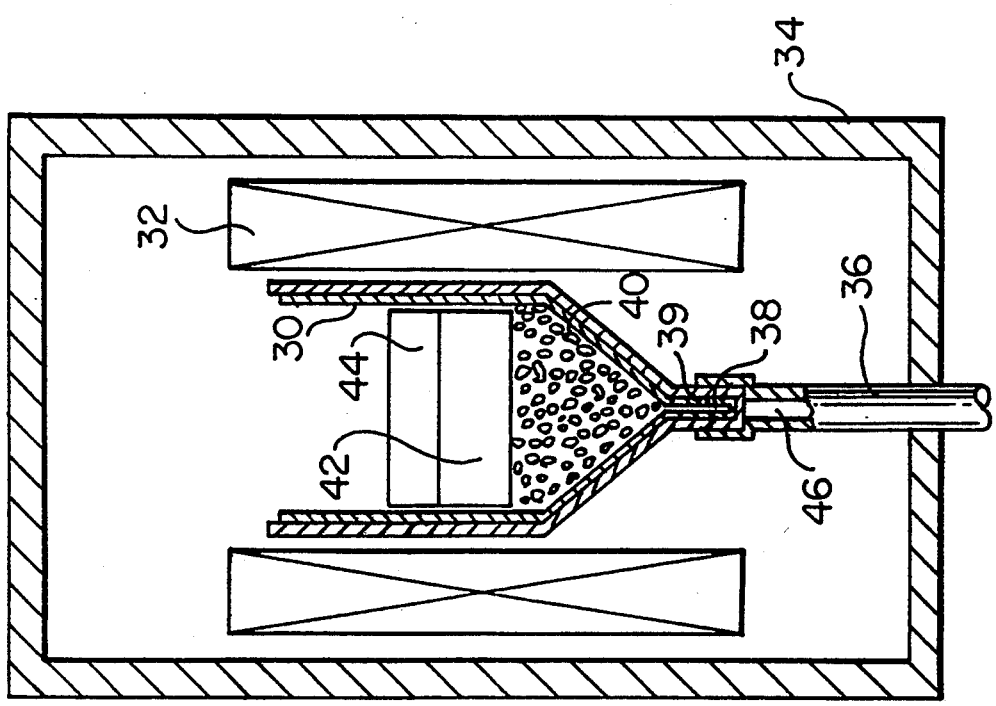

As shown in FIG. 4, a crucible 30, made of a pyrolytic boron nitride (pBN), and a heater 32 surrounding crucible 30 are provided in a chamber 34. Crucible 30 is supported by a crucible shaft 36 and a seed crystal 38 is placed in a holder 39 at the bottom portion of crucible 30. A 1700 g charge of arsenic 40 and a 1500 g charge of gallium 42 as starting charges and 600 g of $B_2O_3$ 44 as a liquid encapsulant were introduced into crucible 30. In the second embodiment, arsenic having a grain size diameter of less than 3 mm was selected and used, similar to the first embodiment.

After charging materials 40, 42 and 44, the distance from the upper surface of arsenic 40 to the upper edge of crucible 30 was measured. Based on the volume of crucible 30 and the density and charge weight of arsenic, the clearance volume for the charge portion of arsenic 40 in crucible 30 was measured. The clearance volume was found to be smaller than the volume of gallium 42.

Crucible 30 with charging materials 40, 42 and 44 were arranged to be heated by the heater 32, and chamber 34 was evacuated up to $1 \times 10^{-2}$ Torr. After this, argon (Ar) gas was introduced into chamber 34 to a pressure of 40 kg/cm$^2$. The charged materials 40, 42, and 44 were then melted by heater 32 in order to directly synthesize the gallium 42 and the arsenic 40.

Figure 5:
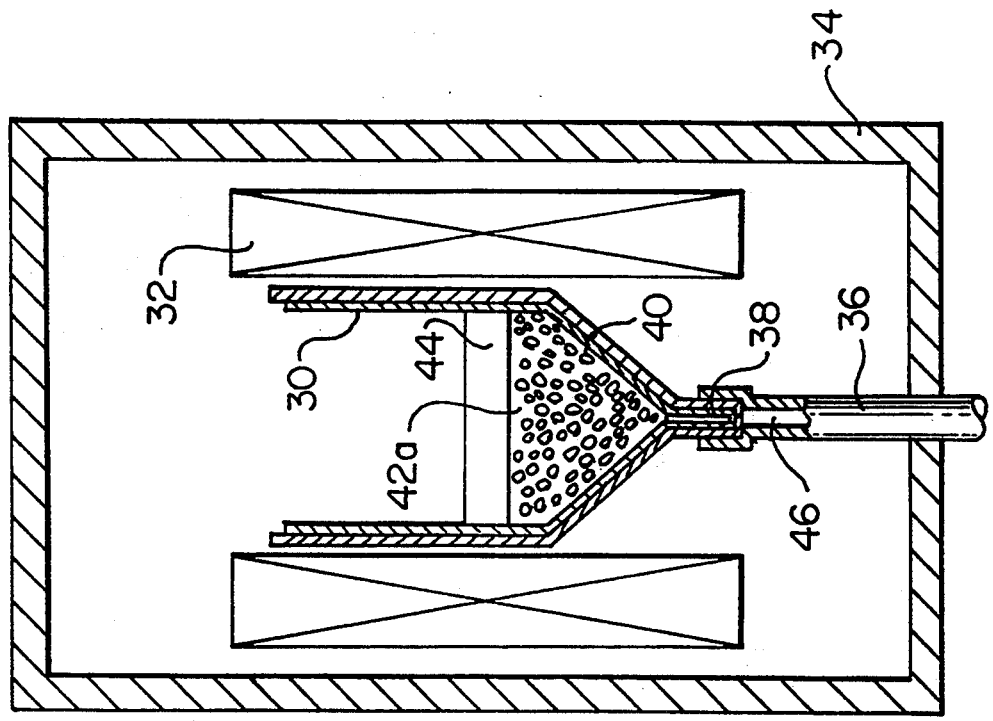
FIG. 4 and FIG. 5 show schematic sectional views of a boule pulling system used in practicing a second embodiment of the invention.

FIG. 5 shows a schematic view, based on observation by a TV camera, of crucible 30 just before the direct synthesis. As is apparent from FIG. 5 the arsenic 40 was completely covered by the gallium melt 42a.

Next, an electromotive force was set at a desired value by using a thermocouple 46, placed under holder 39. Then, crucible shaft 36 was moved downward at a speed of 4 mm/hour in order to obtain a GaAs boule.

A substrate was cut from the GaAs boule obtained, and a high frequency FET was manufactured on the GaAs substrate. Using this process, a yield of about 60% can be obtained in manufacturing the FETs. This is greatly improved, compared with the 45% yield when FETs are manufactured using boules grown by the conventional method.

A similar process for forming a boule was repeated ten times and deviations in the amount of evaporated arsenic after the process were measured. The deviations ranged from 25.1 g to 27.4 g.

For comparison, deviations in the amount of arsenic evaporated according to a conventional Bridgman method were measured. Deviations in the amount of evaporated arsenic were measured for ten samples. The deviations ranged from 31.2 g to 59.9 g. The yield of high frequency FETs manufactured using GaAs substrates made according to the conventional method was 45%, much worse than with the second embodiment.

Numerous modifications and variations of the present invention are possible in light of the above teachings. It is therefore to be understood that, within the scope of the appended claims, the present invention can be practiced in a manner other than as specifically described herein.

For example, other arsenic compounds, such as AlAs and InAs or other semiconductor compounds from groups III-V of the periodic table of elements, such as GaSb also can be used.

Figure 6:
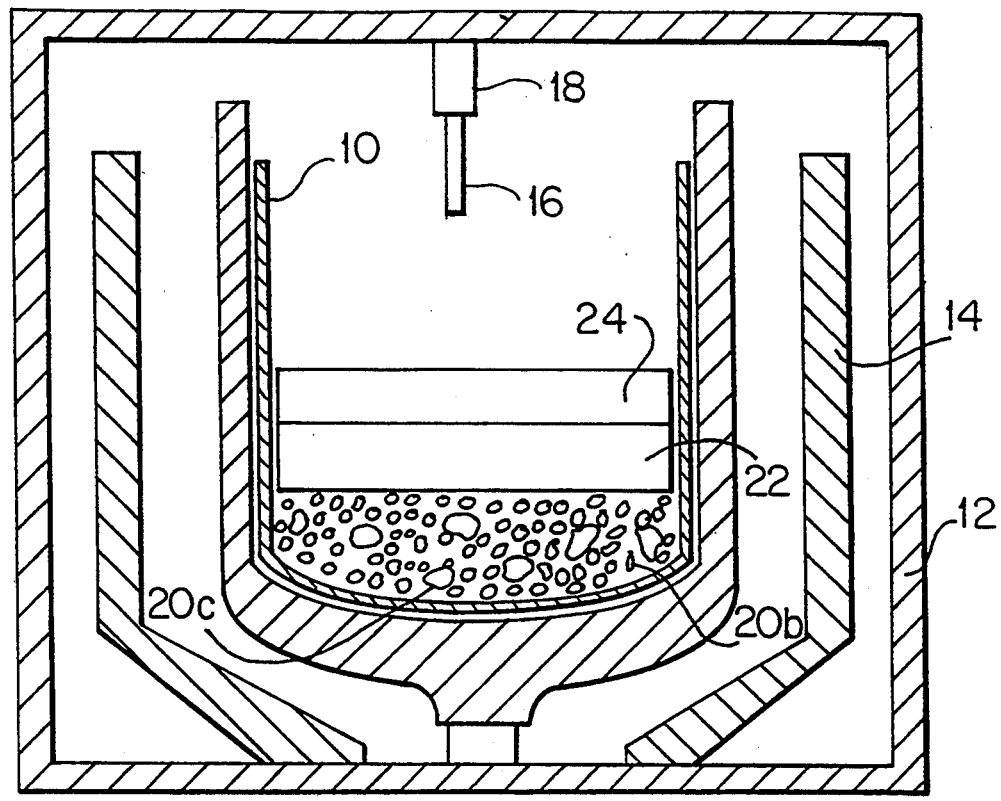
FIG. 6 and FIG. 7 show schematic sectional views of a boule pulling system having other modifications.

Moreover, as a modification of these embodiments, it is possible to use larger granular arsenic of more than 3 mm in grain size diameter, if the large granular arsenic is covered by small granular arsenic having a grain size diameter of less than 3 mm (shown in FIG. 6). The clearance volume of the small and large diameter arsenic 20b, 20c must be smaller than the volume of molten gallium 22a. Similar advantages to the other embodiments can be obtained. Since all of the arsenic granules are not always small, this method should be more practical.

Figure 7:
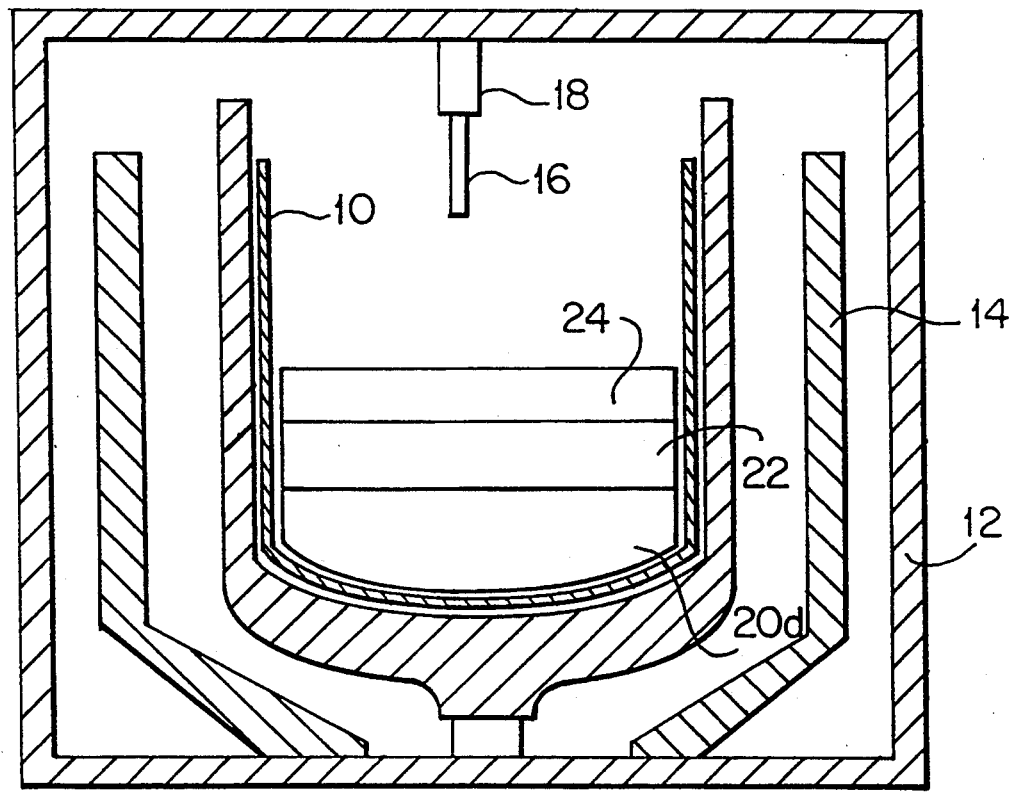

Also, as shown in FIG. 7, it is possible to use a mass of arsenic 20d, whose configuration corresponds to the inner surface of a bottom portion of crucible 10.

In this method, the clearance volume of the mass of arsenic is substantially negligible. That is, the volume is necessarily smaller than the volume of molten gallium 22a. Similar advantages can be obtained using this method.

As described above, according to the invention, deviations in the amount of arsenic evaporated during direct synthesis can be decreased. Thus, deviations of the composition of the initial melt can be reduced to a minimum and a higher quality semiconductor boule, which has little deviation in characteristics, can be obtained.

Additional advantages and modifications will readily occur to those skilled in the art. The invention in its broader aspects is therefore not limited to the specific details, representative apparatus and illustrative examples shown and described. Accordingly departures may be made from such details without departing from the spirit or scope of the general inventive concept defined by the appended claims and their equivalents.

What is claimed is:

1. A method of forming a semiconductor boule, comprising the steps of:
    providing a chamber having a crucible therein;
    introducing a first material and a second material into the crucible, the second material overlying the first material, the first material having a melting point higher than a melting point of the second material;
    heating the crucible to melt the second material to substantially continuously cover the first material with the second material;
    further heating the crucible to melt the first material, thereby forming a melt from the melted first and second materials;
    cooling the melt to grow a directly synthesized boule including a portion of the melted first and second materials; and
    separating the grown boule from the crucible.

2. The method of claim 1, wherein the introducing step includes selecting the first material from group V of the periodic table of elements and the second material from group III of the periodic table of elements.

3. The method of claim 1, wherein the introducing step includes selecting As as the first material, and selecting the second material from at least one of Ga, Al and In.

4. The method of claim 1, wherein the introducing step further comprises introducing a liquid encapsulant into the crucible.

5. The method of claim 1, wherein the first material is granular and has a grain size diameter less than about 3 mm and greater than about 300 $\mu$m.

6. The method of claim 1, wherein the first material comprises smaller granular materials, having a grain size smaller than about 3 mm and greater than about 300 $\mu$m in diameter and larger granular materials, having a grain size greater than 3 mm in diameter, the smaller granular materials substantially surrounding the larger granular materials.

7. The method of claim 1, wherein the first material comprises a mass corresponding in shape to a lower portion of the crucible.

8. The method of claim 1, further including the following steps between the introducing and heating steps:
    measuring a length from an upper surface of the first material to an upper edge of the crucible;
    calculating a volume of an intergranular space of the first material based on said length, a volume of crucible, and a density and a weight of the first material; and
    verifying that the calculated volume of the intergranular space of the first material is smaller than a volume of the second material.

9. The method of claim 1, wherein the introducing step includes selecting Sb as the first material, and selecting the second material from at least one of Ga and In.

10. A method of forming a semiconductor boule, comprising the steps of:
    providing a chamber having a crucible therein;
    charging a first and a second material for forming the boule and a liquid encapsulant into the crucible, the first material defining an intergranular space having a volume smaller than a volume of the second material when melted;
    heating the crucible to melt the first and second materials, thereby forming a melt;
    cooling the melt to grow the boule; and
    separating the grown boule from the crucible.

11. The method of claim 10, wherein the boule includes a semiconductor compound.

12. The method of claim 10, wherein the boule includes at least one of GaAs, AlAs, InAs or GaSb.

13. The method of claim 11, wherein the first material is selected from As and Sb, and the second material is selected from Ga, Al and In.

14. The method of claim 10, wherein the first material is granular and has a grain size diameter less than about 3 mm and greater than about 300 $\mu$m.

15. The method of claim 10, wherein the charging step includes forming the first material from smaller granular particles and larger granular particles, a volume of the smaller particles being greater than a volume of the larger particles for substantially immersing the larger particles in the smaller particles.

16. The method of claim 10, wherein the first material comprises a mass corresponding in shape to the configuration of a lower portion of the crucible, 17. The method of claim 10, wherein the charging step includes selecting a first material having a melting point higher than a melting point of the second material.

* * * * *